United States Patent
Hwang et al.

(10) Patent No.: US 8,570,821 B2
(45) Date of Patent: Oct. 29, 2013

(54) SEMICONDUCTOR MEMORY DEVICE AND METHOD FOR REPAIRING THE SAME

(75) Inventors: Sun Young Hwang, Icheon-si (KR); Sang Il Park, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 159 days.

(21) Appl. No.: 13/191,625

(22) Filed: Jul. 27, 2011

(65) Prior Publication Data
US 2012/0275247 A1  Nov. 1, 2012

(30) Foreign Application Priority Data
Apr. 28, 2011  (KR) .................. 10-2011-0040266

(51) Int. Cl.
*G11C 29/00* (2006.01)

(52) U.S. Cl.
USPC ............. 365/200; 365/189.05; 365/230.04; 365/230.08

(58) Field of Classification Search
USPC ............. 365/200, 189.05, 230.04, 230.08
See application file for complete search history.

(56) References Cited

U.S. PATENT DOCUMENTS

| | | | | |
|---|---|---|---|---|
| 5,406,565 A | * | 4/1995 | MacDonald | 714/711 |
| 6,462,994 B2 | * | 10/2002 | Kim | 365/200 |
| 7,057,966 B2 | * | 6/2006 | Kang et al. | 365/233.11 |
| 7,099,209 B2 | * | 8/2006 | Kang et al. | 365/200 |
| 7,843,746 B2 | * | 11/2010 | Ryu | 365/200 |

FOREIGN PATENT DOCUMENTS

| | | |
|---|---|---|
| JP | 2009-181632 A | 8/2009 |
| KR | 1020010107539 A | 12/2001 |
| KR | 1020030050744 A | 6/2003 |
| KR | 10-0414207 B1 | 12/2003 |

* cited by examiner

*Primary Examiner* — Pho M Luu
(74) *Attorney, Agent, or Firm* — William Park & Associates Patent Ltd.

(57) ABSTRACT

A semiconductor memory device includes a latch address generation unit configured to latch row addresses to generate first and second latch addresses when at least one of memory cells coupled to sub word lines is faulty, wherein the first and second latch addresses select different main word lines, and a repair unit configured to perform a repair operation on memory cells coupled to the main word lines selected by the first and second latch addresses.

17 Claims, 4 Drawing Sheets

SEMICONDUCTOR MEMORY DEVICE AND METHOD FOR REPAIRING THE SAME

CROSS-REFERENCES TO RELATED APPLICATIONS

The present application claims priority under 35 U.S.C. 119(a) to Korean Application No. 10-2011-0040266, filed on Apr. 28, 2011, in the Korean intellectual property Office, and which is incorporated herein by reference in its entirety.

BACKGROUND

As fabrication technologies for semiconductor memory devices advance to higher integration of memory cells, it is highly likely that more failures will occur in the memory cells. Since the semiconductor memory devices cannot operate reliably with faulty memory cells, they are discarded as bad products. This is very inefficient in terms of yield. One way to get around the failed cell problem is by replacing failed cells with redundancy cells provided in a semiconductor memory device.

In order to perform a repair operation, a test is performed to find faulty memory cells in a semiconductor memory device. A compression parallel test can simultaneously determine whether a plurality of memory cells is faulty. A compression parallel test determines the failure of the memory cells by sequentially selecting sub word lines, storing data of the same logic level in the plurality of memory cells coupled to the selected sub word lines, and reading the data at the same time.

FIG. 1 is a block diagram illustrating the configuration of a conventional semiconductor memory device that performs a repair operation.

Referring to FIG. 1, the conventional semiconductor memory device includes a failure occurrence signal generation unit 7, a failed address latch unit 8, and a repair unit 9.

When a test mode signal TM is asserted, the failure occurrence signal generation unit 7 performs a compression parallel test to generate a failure occurrence signal GIOSUMB that is asserted when a failure occurs in memory cells connected to a sub word line selected by first to thirteenth row addresses XADD<1:13>. The first to thirteenth row addresses XADD<1:13> include first to fifth row addresses XADD<1:5> for selecting thirty-two cell blocks included in the semiconductor memory device, sixth to tenth row addresses XADD<6:10> for selecting thirty-two main word lines included in each cell blocks, and eleventh to thirteenth row addresses XADD<11:13> for eight sub word lines coupled to each main word line. Therefore, in the compression parallel test, the first to thirteenth row addresses XADD<1:13> are counted on a 1-bit basis in order to sequentially select all sub word lines included in the semiconductor memory device, and are inputted to the failure occurrence signal generation unit 7.

The failed address latch unit 8 latches the first to tenth row addresses XADD<1:10> to generate first latch addresses XADDLAT1<1:10> when the failure occurrence signal GIOSUMB is first asserted, and latches the first to tenth row addresses XADD<1:10> to generate second latch addresses XADDLAT2<1:10> when the failure occurrence signal GIOSUMB is asserted a second time.

The repair unit 9 performs a repair operation to substitute redundancy cells for faulty memory cells coupled to the main word line by the first latch addresses XADDLAT1<1:10> and the second latch addresses XADDLAT2<1:10>. Since the first latch addresses XADDLAT1<1:10> and the second latch addresses XADDLAT2<1:10> are generated by latching the first to tenth row addresses XADD<1:10>, they contain information on the main word lines and the cell blocks coupled to the faulty memory cells.

As described above, the conventional semiconductor memory device performs two times the repair operation of latching the first to tenth row addresses XADD<1:10> at two points of time when the failure occurs in the memory cells coupled to the sub word line as the compression parallel test result and replacing the memory cells coupled to the main word lines with the redundancy cells.

However, since the compression parallel test sequentially selects the sub word lines and determines whether the memory cells coupled to the selected sub word lines are faulty, the first latch addresses XADDLAT1<1:10> and the second latch addresses XADDLAT2<1:10> generated by the failed address latch unit 8 may have the same address. In this case, even though the sub word lines coupled to the faulty memory cells are different, the main word lines are identical and thus the repair operation is unnecessarily performed by the same main word line, causing degradation in repair efficiency.

SUMMARY

Various embodiments of the present invention are directed to a semiconductor memory device and a method for repairing the same, in which a repair operation is performed by latching row addresses for selecting main word lines when memory cells coupled to different main word lines are faulty, thereby improving repair efficiency.

In one embodiment, a semiconductor memory device includes a latch address generation unit configured to latch row addresses to generate first and second latch addresses when at least one of memory cells coupled to sub word lines is faulty, wherein the first and second latch addresses select different main word lines. A repair unit may be configured to perform a repair operation on memory cells coupled to the main word lines selected by the first and second latch addresses.

In another embodiment, a method for repairing a semiconductor memory device includes latching a row address to generate a first latch address when at least one of memory cells coupled to a first sub word line is faulty. The first latch address may be compared with the row address to generate a comparison signal when at least one of the memory cells coupled to a second sub word line are faulty. The row address may be latched to generate a second latch address in response to the comparison signal, wherein the first and second latch addresses select different main word lines.

BRIEF DESCRIPTION OF THE DRAWINGS

The above and other aspects, features, and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
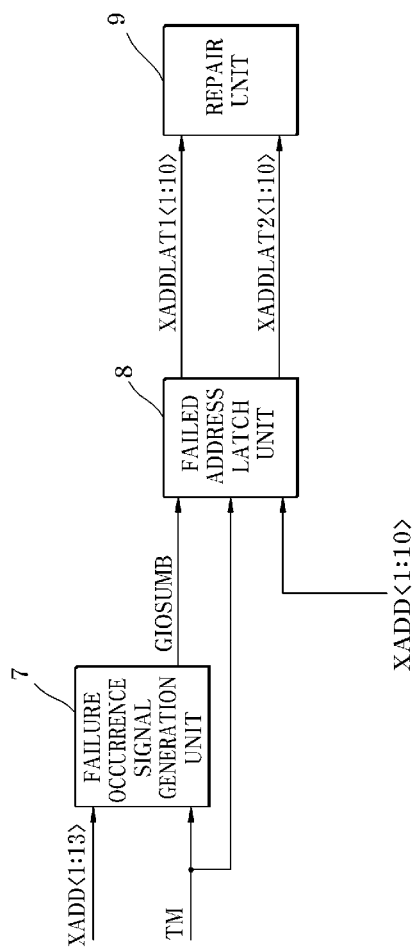
FIG. 1 is a block diagram illustrating the configuration of a conventional semiconductor memory device that performs a repair operation.
Figure 2:
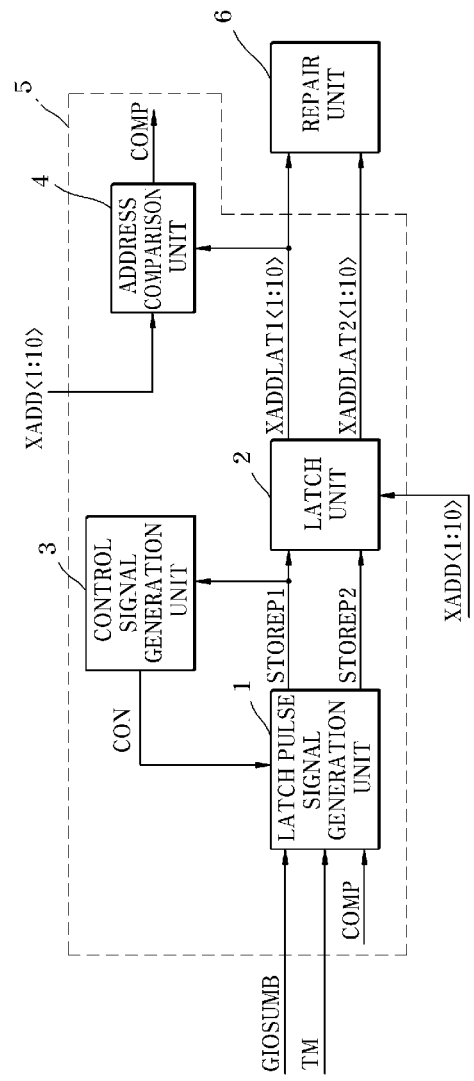
FIG. 2 is a block diagram illustrating the configuration of a semiconductor memory device performing a repair operation according to an embodiment of the present invention.

FIG. 2 is a block diagram illustrating the configuration of a semiconductor memory device performing a repair operation according to an embodiment of the present invention.

Referring to FIG. 2, the semiconductor memory device according to an embodiment of the present invention includes a latch address generation unit 5 and a repair unit 6. The latch address generation unit 5 includes a latch pulse signal generation unit 1, a latch unit 2, a control signal generation unit 3, and an address comparison unit 4.

The latch pulse signal generation unit 1 generates a first latch pulse signal STOREP1 in response to a control signal CON when a test mode signal TM is asserted and a failure occurrence signal GIOSUMB is first asserted. The latch pulse signal generation unit 1 generates a second latch pulse signal STOREP2 in response to a control signal CON and a comparison signal COM when the failure occurrence signal GIOSUMB is again asserted. The latch unit 2 latches first to tenth row addresses XADD<1:10> in response to the first latch pulse signal STOREP1 and generates first latch addresses XADDLAT1<1:10>. The latch unit 2 latches the first to tenth row addresses XADD<1:10> in response to the second latch pulse signal STOREP2, which is generated after the first latch pulse signal STOREP1 is generated, and generates second latch addresses XADDLAT2<1:10>. The control signal generation unit 3 changes the control signal CON to a logic high level in response to the first latch pulse signal STOREP1. The address comparison unit 4 compares the first latch addresses XADDLAT1<1:10> with the first to tenth row addresses XADD<1:10> and generates a comparison signal COMP. The repair unit 6 performs a repair operation on main word lines selected by the first latch addresses XADDLAT1<1:10> and the second latch addresses XADDLAT2<1:10>.

Figure 3:
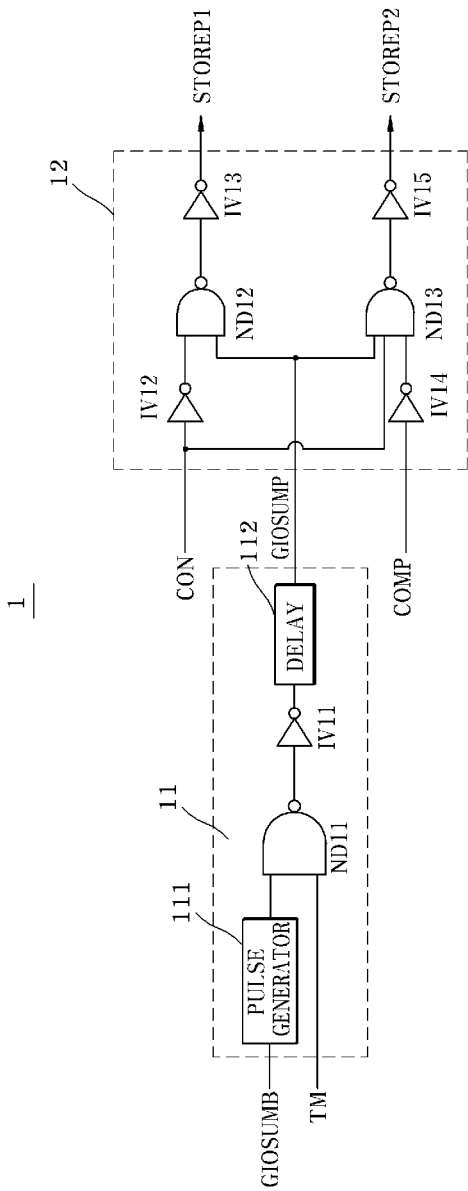
FIG. 3 is a circuit diagram of a latch pulse signal generation section included in the semiconductor memory device illustrated in FIG. 2.

Referring to FIG. 3, the latch pulse signal generation unit 1 includes a failure occurrence pulse signal generation section 11 and a latch pulse signal output section 12.

The failure occurrence pulse signal generation section 11 includes a pulse generator 111, a NAND gate ND11, an inverter IV11, and a delay 112. The pulse generator 111 generates a pulse when the failure occurrence signal GIOSUMB is asserted. The NAND gate ND11 performs a NAND operation on the test mode signal TM and the output signal of the pulse generator 111. The inverter IV11 inverts and buffers the output signal of the NAND gate ND11. The delay 112 delays the output signal of the inverter IV11 by a predetermined time. The failure occurrence pulse signal generation section 11 configured as above generates a failure occurrence pulse signal GIOSUMP when the test mode signal TM is at a logic high level and the failure occurrence signal GIOSUMB is at a logic low signal.

The latch pulse signal output section 12 includes an inverter IV12, a NAND gate ND12, an inverter IV13, an inverter IV14, a NAND gate ND13, and an inverter IV15. The inverter IV12 inverts and buffers the control signal CON. The NAND gate ND12 performs a NAND operation on the inverted and buffered control signal CON and the failure occurrence pulse signal GIOSUMP. The inverter IV13 inverts and buffers the output signal of the NAND gate ND12. The inverter IV14 inverts and buffers the comparison signal COMP. The NAND gate ND13 performs a NAND operation on the control signal CON, the failure occurrence pulse signal GIOSUMP, and the inverted and buffered comparison signal COMP. The inverter IV15 inverts the inverted and buffered output signal of the NAND gate ND13. The latch pulse signal output section 12 configured as above buffers the failure occurrence pulse signal GIOSUMP in response to the control signal CON of a logic low level and generates the first latch pulse signal STOREP1. The latch pulse signal output section 12 configured as above buffers the failure occurrence pulse signal GIOSUMP in response to the control signal of a logic high level and the comparison signal COMP of a logic low level and generates the second latch pulse signal STOREP2.

The latch pulse signal generation unit 1 configured as above generates the first latch pulse signal STOREP1 in response to the control signal CON of a logic low level when the test mode signal TM is enabled to a logic high level and the failure occurrence signal GIOSUMB is first enabled. Thereafter, the latch pulse signal generation unit 1 generates the second latch pulse signal STOREP2 in response to the control signal CON of a logic high level and the comparison signal of a logic low level when the failure occurrence signal GIOSUMB is again enabled. The test mode signal TM is enabled to a logic high level when the compression parallel test is performed. The failure occurrence signal GIOSUMB is enabled when memory cells coupled to the sub word lines are found to be faulty during the compression parallel test. The control signal CON and the comparison signal COMP are generated by the control signal generation unit 3 and the address comparison unit 4, respectively, which will be described later.

Figure 4:
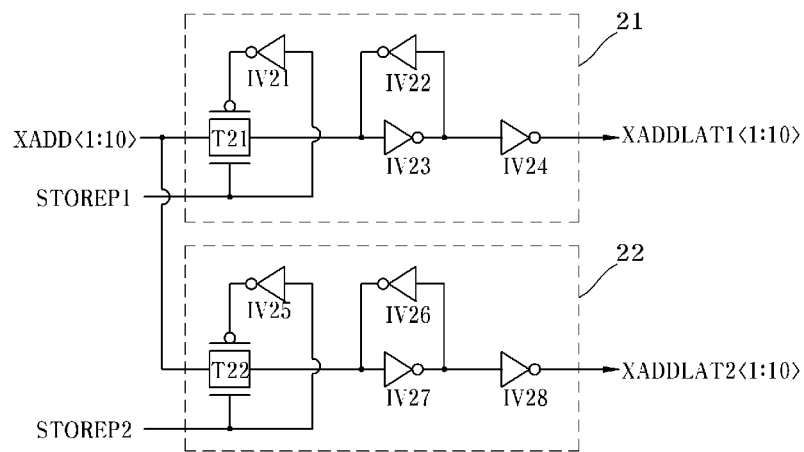
FIG. 4 is a circuit diagram of a latch section included in the semiconductor memory device illustrated in FIG. 2.

Referring to FIG. 4, the latch unit 2 includes a first latch section 21 and a second latch section 22.

The first latch section 21 includes a transfer gate T21 and four inverters IV21 to IV24 for latching one address bit. The first latch section 21 configured as above latches first to tenth row addresses XADD<1:10> in response to the first latch pulse signal STOREP1 and generates latch addresses XADDLAT1<1:10>.

The second latch section 22 includes a transfer gate T22 and four inverters IV25 to IV28 for latching one address bit. The second latch section 22 configured as above latches the first to tenth row addresses XADD<1:10> in response to the second latch pulse signal STOREP2 and generates the second latch addresses XADDLAT2<1:10>.

Figure 5:
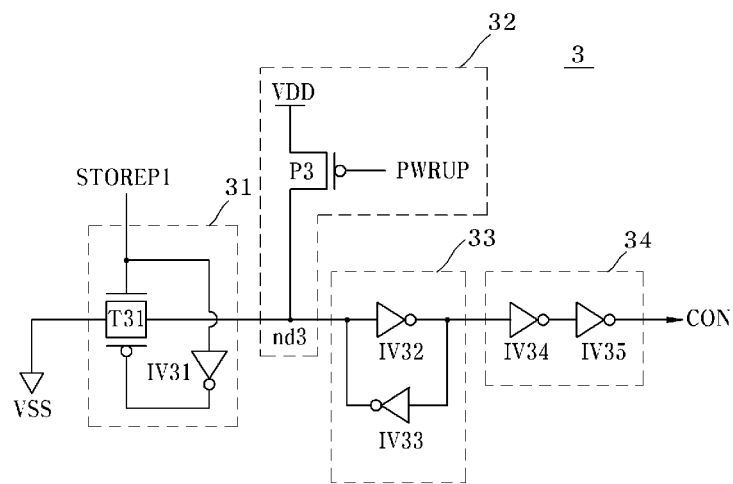
FIG. 5 is a circuit diagram of a control signal generation section included in the semiconductor memory device illustrated in FIG. 2.

Referring to FIG. 5, the control signal generation unit 3 includes a switch section 31, a reset section 32, a latch 33, and a buffer 34.

The switch section 31 includes an inverter IV31 and a transfer gate T31. The inverter IV31 inverts and buffers the first latch pulse signal STOREP1. The transfer gate T31 is coupled between a node nd3 and a ground voltage terminal VSS. The switch section 31 configured as above changes the signal of the node nd3 to a logic low level when the first latch pulse signal STOREP1 is generated. The reset section 32 includes a pull-up driver P3 and pull-up drives the node nd3 to an external voltage VDD when a power-up signal PWRUP is at a logic low level. The power-up signal PWRUP rises along the external voltage VDD until before the external voltage VDD reaches a target level, and changes to a logic low level after the external voltage VDD reaches the target level. The latch 33 includes two inverters IV32 and IV33. The latch 33 configured as above latches the signal of the node nd3 and outputs the latched signal to the buffer 34. The buffer 34 includes two inverters IV34 and IV35. The buffer 34 configured as above buffers the output signal of the latch 33 and outputs the buffered signal as the control signal CON.

The control signal generation unit 3 configured as above generates the control signal CON reset to a logic low level in a period in which the power-up signal PWRUP is at a logic low level. The control signal generation unit 3 changes the control signal CON to a logic high level in response to the first latch pulse signal STOREP1 in a period in which the power-up signal PWRUP is at a logic high level. The power-up signal PWRUP is enabled when the power supply voltage reaches the preset level.

The address comparison unit 4 performs an exclusive NOR operation on the first latch addresses XADDLAT1<1:10> and the first to tenth row addresses XADD<1:10> and generates the comparison signal COMP. The address comparison unit 4 generates the comparison signal COMP of a logic high level when the first latch addresses XADDLAT1<1:10> and the first to tenth row addresses XADD<1:10> have the same address.

The repair unit 6 performs a repair operation on the main word lines selected by the first latch addresses XADDLAT1<1:10> and the second latch addresses XADDLAT2<1:10>. Since the repair unit 6 performs the repair operation on the main word line, the latch unit 2 latches the first to tenth row addresses XADD<1:10> containing information on the cell blocks and the main word lines, and outputs the first latch addresses XADDLAT1<1:10> and the second latch addresses XADDLAT2<1:10> to the repair unit 6.

The operation of the semiconductor memory device configured as above will be described below with reference to FIGS. 2 to 5, base on two cases: the first case in which the first latch addresses XADDLAT1<1:10> and the first to tenth row addresses XADD<1:10>have the same address, and the second case in which the first latch addresses XADDLAT1<1:10> and the first to tenth row addresses XADD<1:10> have different addresses.

The first case in which the first latch addresses XADDLAT1<1:10> and the first to tenth row addresses XADD<1:10> have the same address will be described below.

The latch pulse signal generation unit 1 generates the first latch pulse signal STOREP1 in response to the control signal CON of a logic low level when the test mode signal TM is enabled to a logic high level and the failure occurrence signal GIOSUMB is first enabled. The latch unit 2 latches the first to tenth row addresses XADD<1:10>in response to the first latch pulse signal STOREP1 and generates the first latch addresses XADDLAT1<1:10>. The repair unit 6 performs the repair operation on the main word lines selected by the first latch addresses XADDLAT1<1:10>.

Then, the latch pulse signal generation unit 1 receives the failure generation signal GIOSUMB when the test mode signal TM is enabled to a logic high level. The address comparison unit 4 compares the first latch addresses XADDLAT1<1:10> with the first to tenth row addresses XADD<1:0> and generates the comparison signal COMP of a logic high level. The control signal generation unit 3 generates the control signal CON that changes to a logic high level in response to the first latch pulse signal STOREP1. Therefore, even though the latch pulse signal generation unit 1 receives the failure occurrence signal GIOSUMB, it does not generate the second latch pulse signal STOREP2 because both of the control signal CON and the comparison signal COMP are at a logic high level. Therefore, since the latch unit 2 cannot latch the first to tenth row addresses XADD<1:10>, it cannot generate the second latch addresses XADDLAT2<1:10>.

The second case in which the first latch addresses XADDLAT1<1:10> and the first to tenth row addresses XADD<1:10> have different addresses will be described below.

The latch pulse signal generation unit 1 generates the first latch pulse signal STOREP1 in response to the control signal CON of a logic low level when the test mode signal TM is enabled to a logic high level and the failure occurrence signal GIOSUMB is first enabled. The latch unit 2 latches the first to tenth row addresses XADD<1:10> in response to the first latch pulse signal STOREP1 and generates the first latch addresses XADDLAT1<1:10>. The repair unit 6 performs the repair operation on the main word lines selected by the first latch addresses XADDLAT1<1:10>.

Then, the latch pulse signal generation unit 1 receives the failure generation signal GIOSUMB when the test mode signal TM is enabled to a logic high level. The address comparison unit 4 compares the first latch addresses XADDLAT1<1:10> with the first to tenth row addresses XADD<1:0> and generates the comparison signal COMP of a logic low level. The control signal generation unit 3 generates the control signal CON which changes to a logic high level in response to the first latch pulse signal STOREP1. Since the control signal CON is at a logic high level and the comparison signal COMP is at a logic low level, the latch pulse signal generation unit 1 generates the second latch pulse signal STOREP2 when the failure occurrence signal GIOSUMB is again enabled. The latch unit 2 latches the first to tenth row addresses XADD<1:10> in response to the second latch pulse signal STOREP2 and generates the second latch addresses XADDLAT2<1:10>. The repair unit 6 performs the repair operation on the main word lines selected by the second latch addresses XADDLAT2<1:10>.

The semiconductor memory devices according to the embodiments of the present invention do not perform overlapping repair operations by latching the row addresses for selecting the main word lines when the memory cells coupled to different main word lines are faulty, thereby improving repair efficiency.

The embodiments of the present invention have been disclosed above for illustrative purposes. Those skilled in the art will appreciate that various modifications, additions, and substitutions are possible, without departing from the scope and spirit of the invention as disclosed in the accompanying claims.

What is claimed is:

1. A semiconductor memory device comprising:
    a latch address generation unit configured to latch row addresses to generate first and second latch addresses when at least one of memory cells coupled to sub word lines is faulty, wherein the first and second latch addresses select different main word lines; and
    a repair unit configured to perform a repair operation on memory cells coupled to the main word lines selected by the first and second latch addresses,
    wherein the latch address generation unit generates the first and second latch addresses in response to a failure occurrence signal, which is asserted when at least one of the memory cells coupled to the sub word lines is faulty, and a test mode signal, which is asserted when a compression parallel test is performed.

2. The semiconductor memory device of claim 1, wherein, when at least one of memory cells coupled to a first sub word line is faulty, the latch address generation unit latches the row address to generate the first latch address and, when at least one of memory cells coupled to a second sub word line is faulty, the latch address generation unit compares the row address with the first latch address, latches the row address, and generates the second latch address.

3. The semiconductor memory device of claim 1, wherein the latch address generation unit comprises:
   a latch pulse signal generation unit configured to generate a first latch pulse signal in response to the failure occurrence signal and generate a second latch pulse signal in response to the failure occurrence signal and a comparison signal;
   a latch unit configured to latch the row address to generate the first latch address in response to the first latch pulse signal, and latch the row address to generate the second latch addresses in response to the second latch pulse signal; and
   an address comparison unit configured to compare the row address with the first latch address to generate the comparison signal.

4. The semiconductor memory device of claim 3, wherein the latch pulse signal generation unit generates the second latch pulse signal after generating the first latch pulse signal.

5. The semiconductor memory device of claim 3, wherein the comparison signal is generated with a first logic level when the row address and the first latch address are different, and the comparison signal is generated with a second logic level when the row address and the first latch address are the same.

6. The semiconductor memory device of claim 3, wherein the latch pulse signal generation unit comprises:
   a failure occurrence pulse signal generation section configured to generate a pulse in a failure occurrence pulse signal when the test mode signal is asserted and the failure occurrence signal is asserted; and
   a latch pulse signal output section configured to buffer the failure occurrence pulse signal to generate the first latch pulse signal, and generate the second latch pulse signal in response to the comparison signal.

7. The semiconductor memory device of claim 3, wherein the latch unit comprises:
   a first latch section configured to latch the row address to generate the first latch address in response to the first latch pulse signal; and
   a second latch section configured to latch the row address to generate the second latch address in response to the second latch pulse signal.

8. The semiconductor memory device of claim 1, wherein the latch address generation unit comprises:
   a latch pulse signal generation unit configured to generate a first latch pulse signal in response to the failure occurrence signal and a control signal, and generate a second latch pulse signal in response to the failure occurrence signal, a comparison signal, and the control signal;
   a latch unit configured to latch the row address and generate first latch address in response to the first latch pulse signal, and latch the row address to generate second latch address in response to the second latch pulse signal;
   a control signal generation unit configured to generate the control signal whose level is changed in response to the first latch pulse signal; and
   an address comparison unit configured to compare the row address with the first latch address to generate the comparison signal.

9. The semiconductor memory device of claim 8, wherein the comparison signal is generated with a first logic level when the row address and the first latch address are different, and the comparison signal is generated with a second logic level when the row address and the first latch address are the same.

10. The semiconductor memory device of claim 8, wherein the latch pulse signal generation unit comprises:
    a failure occurrence pulse signal generation section configured to generate a pulse in a failure occurrence pulse signal when the test mode signal is asserted and the failure occurrence signal is asserted; and
    a latch pulse signal output section configured to buffer the failure occurrence pulse signal and generate a first latch pulse signal in response to the control signal, and buffer the failure occurrence pulse signal and generate a second latch pulse signal in response to the control signal and the comparison signal.

11. The semiconductor memory device of claim 8, wherein the latch unit comprises:
    a first latch section configured to latch the row address to generate the first latch address in response to the first latch pulse signal; and
    a second latch section configured to latch the row address to generate the second latch address in response to the second latch pulse signal.

12. The semiconductor memory device of claim 8, wherein the control signal generation unit comprises:
    a switch section configured to couple a node to a ground voltage terminal in response to the first latch pulse signal;
    a latch configured to latch a signal of the node; and
    a buffer configured to buffer an output signal of the latch.

13. The semiconductor memory device of claim 12, wherein the control signal generation unit further comprises a reset section configured to reset the node in response to a power-up signal.

14. The semiconductor memory device of claim 13, wherein the power-up signal is asserted when a power supply voltage reaches a preset level.

15. A method for repairing a semiconductor memory device, comprising:
    generating a first latch pulse signal in response to a failure occurrence signal, which is asserted when at least one of memory cells coupled to a first sub word line is faulty, and a test mode signal, which is asserted when a compression parallel test is performed;
    latching a row address to generate a first latch address in response to the first latch pulse signal;
    comparing the first latch address with the row address to generate a comparison signal when at least one of memory cells coupled to a second sub word line is faulty; and
    latching the row address to generate a second latch address in response to the comparison signal, wherein the first and second latch addresses select different main word lines.

16. The method of claim 15, further comprising performing a repair operation on the main word lines selected by the first and second latch addresses.

17. The method of claim 16, wherein the generating the second latch address in response to the comparison signal comprises:
    generating a second latch pulse signal in response to a failure occurrence signal, which is asserted when at least one of the memory cells coupled to the second sub word line is faulty, a test mode signal, which is asserted when a compression parallel test is performed, and the comparison signal; and latching the row address to generate the second latch address in response to the second latch pulse signal.

* * * * *